(12) United States Patent
Shimizu et al.

(10) Patent No.: US 9,772,198 B2
(45) Date of Patent: Sep. 26, 2017

(54) DISPLACEMENT SENSOR AND DISPLACEMENT DETECTION METHOD

(71) Applicant: Murata Machinery, Ltd., Kyoto-shi, Kyoto (JP)

(72) Inventors: Tetsuya Shimizu, Kyoto (JP); Hideki Kubo, Kyoto (JP); Satoshi Hanaka, Kyoto (JP); Tatsuo Ota, Kyoto (JP); Shogo Terada, Kyoto (JP)

(73) Assignee: MURATA MACHINERY, LTD., Kyoto (JP)

( * ) Notice: Subject to any disclaimer, the term of this patent is extended or adjusted under 35 U.S.C. 154(b) by 154 days.

(21) Appl. No.: 14/759,710

(22) PCT Filed: Dec. 18, 2013

(86) PCT No.: PCT/JP2013/083884
§ 371 (c)(1),
(2) Date: Jul. 8, 2015

(87) PCT Pub. No.: WO2014/109190
PCT Pub. Date: Jul. 17, 2014

(65) Prior Publication Data
US 2015/0345992 A1  Dec. 3, 2015

(30) Foreign Application Priority Data

Jan. 10, 2013 (JP) .................. 2013-002329

(51) Int. Cl.
*G01D 5/14* (2006.01)
*G01R 25/00* (2006.01)
(Continued)

(52) U.S. Cl.
CPC .......... *G01D 5/14* (2013.01); *G01D 5/24476* (2013.01); *G01R 17/00* (2013.01); *G01R 25/005* (2013.01)

(58) Field of Classification Search
CPC .... G01D 5/14; G01D 5/24476; G01R 25/005; G01R 17/00
See application file for complete search history.

(56) References Cited

U.S. PATENT DOCUMENTS 5,399,967 A    3/1995  Carscadden
2010/0271011 A1  10/2010  Shimizu
(Continued)

FOREIGN PATENT DOCUMENTS

JP    59-25441 B2    6/1984
JP    05-196478 A    8/1993
(Continued)

OTHER PUBLICATIONS

English translation of Official Communication issued in corresponding International Application PCT/JP2013/083884, mailed on Jul. 16, 2015.
(Continued)

*Primary Examiner* — Jermele M Hollington
*Assistant Examiner* — Zannatul Ferdous
(74) *Attorney, Agent, or Firm* — Keating & Bennett, LLP

(57) ABSTRACT

In a linear displacement sensor, two magnets with different polarities define one pitch of a magnetic scale. kn (k is a natural number greater than or equal to 2, n is a natural number greater than or equal to 1) sensor units configured to output a plurality of signals whose period is one pitch and whose phases with respect to the pitch are different are arranged along the magnetic scale in a one-pitch segment. Periodic errors with n periods per pitch of the sensor units are canceled out by averaging the phases from the kn sensor units.

9 Claims, 6 Drawing Sheets

(51) Int. Cl.
*G01R 17/00* (2006.01)
*G01D 5/244* (2006.01)

(56) References Cited

U.S. PATENT DOCUMENTS

| | | | |
|---|---|---|---|
| 2011/0031962 A1* | 2/2011 | Arakawa | H02K 29/08 |
| | | | 324/207.11 |
| 2011/0060490 A1 | 3/2011 | Sato | |
| 2011/0156505 A1 | 6/2011 | Miyashita et al. | |
| 2012/0038359 A1 | 2/2012 | Saruki et al. | |
| 2012/0139532 A1* | 6/2012 | Ueda | G01D 5/2448 |
| | | | 324/207.22 |
| 2013/0060521 A1 | 3/2013 | Shimizu | |

FOREIGN PATENT DOCUMENTS

| | | | | |
|---|---|---|---|---|
| JP | 06-018279 A | | 1/1994 | |
| JP | 2007-155618 A | | 6/2007 | |
| JP | 2009-276261 A | | 11/2009 | |
| JP | 2010-256171 A | | 11/2010 | |
| JP | 2011-59839 A | | 3/2011 | |
| JP | 2012037467 A | * | 2/2012 | ............ B82Y 25/00 |
| JP | 4919177 B2 | | 4/2012 | |
| JP | 2012-107929 A | | 6/2012 | |
| WO | 2009/054391 A1 | | 4/2009 | |

OTHER PUBLICATIONS

Official Communication issued in International Patent Application No. PCT/JP2013/083884, dated Feb. 4, 2014.

* cited by examiner

F I G. 5
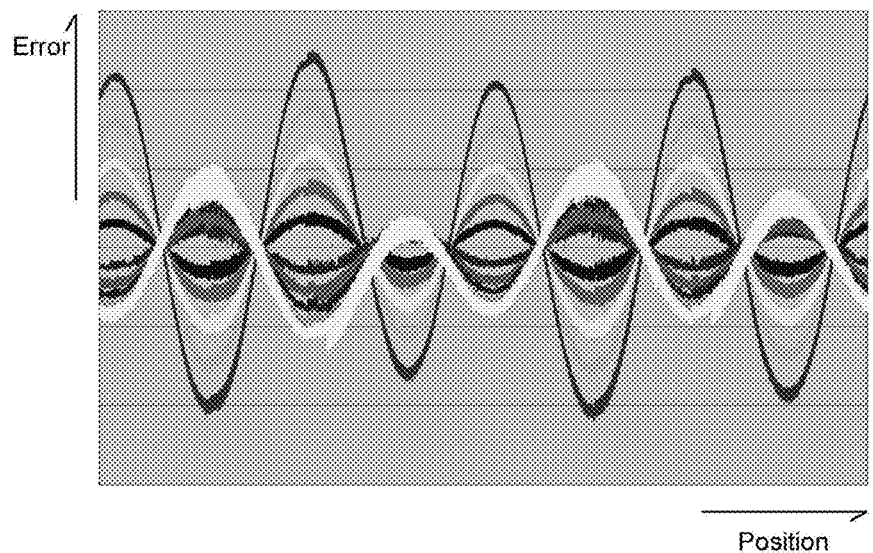
F I G. 6
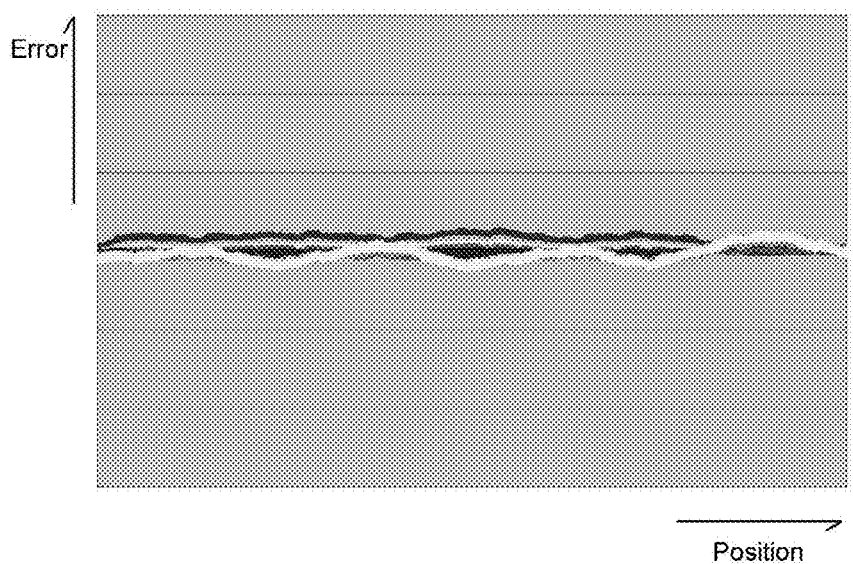

F I G. 7
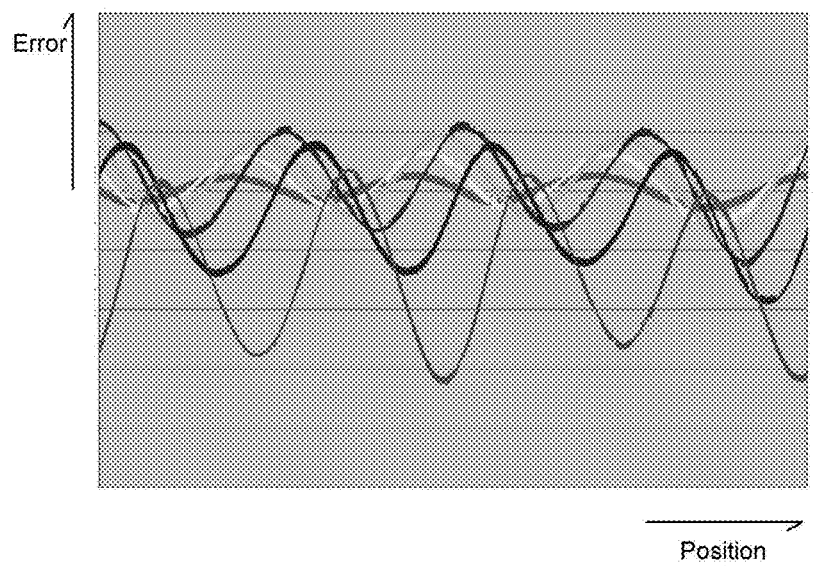
F I G. 8
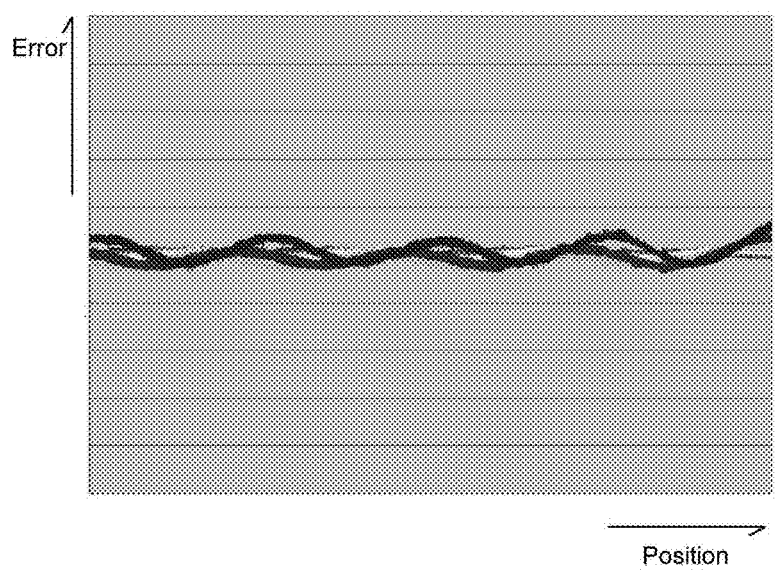

F I G. 9
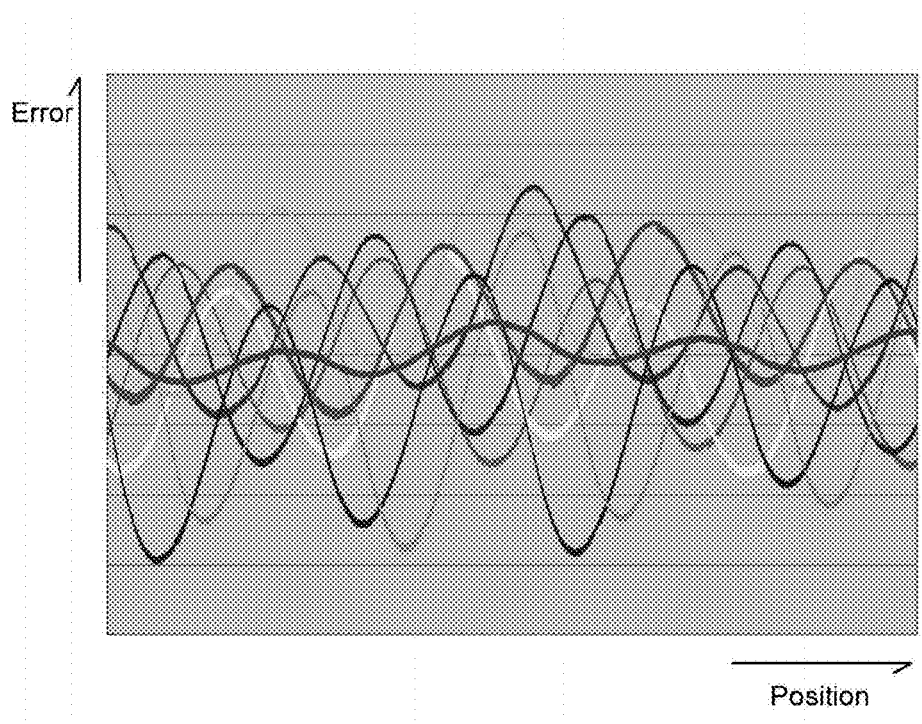

DISPLACEMENT SENSOR AND DISPLACEMENT DETECTION METHOD

BACKGROUND OF THE INVENTION

1. Field of the Invention

The present invention relates to a displacement sensor, and in particular relates to error reduction.

2. Description of the Related Art

The inventors of the present invention have developed a displacement sensor that has a combination of a magnetic scale and magnetic elements such as coils (e.g., JP 4919177B: JP 4919177B). Errors appear in this kind of sensor, and it is desired that the errors are reduced.

SUMMARY OF THE INVENTION

Preferred embodiments of the present invention reduce errors in a displacement sensor.

A preferred embodiment of the present invention is a displacement sensor that detects a position based on a magnetic scale by magnetic elements, including a magnetic scale including a plurality of pitches arranged linearly and including two magnets with different polarities or a pair of a magnetic element and a non-magnetic element; 4n sensor units aligned in series in one pitch along the magnetic scale such that 4n signals with phases $\theta$ with respect to the pitch, each shifted by $(90/n)$ degrees, are output, where n is 2 or 4; an averaging unit configured to output an average of the 4n signals; and a drive circuit configured to apply an AC signal with a $\sin \omega t$ waveform to the 4n sensor units; wherein each of the 4n sensor units includes a bridge including four magnetic elements and a phase detection unit configured to retrieve signals corresponding to $\sin \theta \sin \omega t$ and $\cos \theta \sin \omega t$ from the bridge and output a signal indicating the phase $\theta$ with respect to the pitch according to an addition theorem, and signals of phase detection units of the 4n sensor units indicating the phase $\theta$ are 4n signals having periodic errors in which one pitch of the magnetic scale corresponds to n periods.

Another preferred embodiment of the present invention provides a method for detecting displacement by detecting a position based on a magnetic scale by magnetic elements, the method including providing a magnetic scale including a plurality of pitches arranged linearly and including a pair of two neighboring magnets with different polarities in a magnet array for a linear motor; providing 4n sensor units aligned in series in one pitch along the magnetic scale such that 4n signals with phases $\theta$ with respect to the pitch, each shifted by $(90/n)$ degrees, are output, where n is 2 or 4; providing a drive circuit configured to apply an AC signal with a $\sin \omega t$ waveform to the 4n sensor units, each of the 4n sensor units including a bridge including four magnetic elements and a phase detection unit configured to retrieve signals corresponding to $\sin \theta \sin \omega t$ and $\cos \theta \sin \omega t$ from the bridge and output a signal indicating the phase $\theta$ with respect to the pitch according to an addition theorem, and signals of phase detection units of the 4n sensor units indicating the phase $\theta$ are 4n signals having periodic errors in which one pitch of the magnetic scale corresponds to n periods; and averaging the 4n signals using an averaging unit to cancel out the periodic errors.

The inventors of preferred embodiments of the present application discovered that, with the displacement sensor configured to detect a position based on a magnetic scale using magnetic elements, periodic errors occur. In the errors, two magnets correspond to 1 period, 2 periods, or 4 periods of errors, or such that a pair of a magnetic element and a non-magnetic element corresponds to 1 period, 2 periods, or 4 periods of errors. From the viewpoint of the sensor units, when shifted by one pitch along the magnetic scale including a plurality of pitches, the magnetic environment from the magnetic scale is the same and the errors are also the same. Accordingly, the errors repeat with each pitch, and the length of one period of the error (error wavelength) is the pitch divided by an integer. Also, if kn sensor units are provided along one pitch of the magnetic scale, the phases of kn outputs with respect to the error are each shifted by 360/kn degrees, and by averaging these outputs, the influence of the errors is reduced. In preferred embodiments of the present invention, periodic errors that repeat over n periods per pitch of the magnetic scale are canceled out, and the displacement is detected accurately. Note that in this specification, descriptions regarding the displacement sensor apply as-is to the displacement detection method as well, and descriptions regarding the displacement detection method apply as-is to the displacement sensor as well.

Letting k be 4, kn signals whose phases with respect to the error are each shifted 90/n degrees are obtained, and upon averaging these signals, the influence of the error is particularly reduced.

Preferably, the magnetic scale includes a plurality of the pitches, the sensor units are configured to output offset signals of the pitches during detection, and the averaging unit obtains the average of the phases and the offset signals. Upon averaging the phases from the kn sensor units, the measurement range is reduced to 1/kn the length of one pitch. Here, by averaging the offset signals, the measurement range is extended to the entire length of the magnetic scale.

In particular, it is preferable that the sensor units have periodic errors with n periods per pitch, and the periodic errors are canceled out by averaging the signals from the kn sensor units. By doing so, kn outputs whose phases with respect to the error are each shifted by 360/kn degrees are obtained, and upon averaging these outputs, the displacement is accurately detected.

Preferably, a magnetic scale is arranged linearly and the displacement sensor is a linear displacement sensor configured to detect a linear position along the magnetic scale.

In particular, it is preferable that the magnetic scale is a magnet array for a linear motor, and a linear position along the magnetic scale is obtained in order to drive the linear motor.

Also, a linear displacement sensor according to a preferred embodiment of the present invention detects a linear position based on a magnetic scale by magnetic elements, and includes a magnetic scale including a plurality of pitches arranged linearly and including a pair of two neighboring magnets with different polarities in a magnet array for a linear motor; 4n sensor units aligned along a length of one pitch such that when the length of the one pitch is p, positions along the magnetic scale differ by $p/(4n)$, where n is 2 or 4; an averaging unit configured to output an average of outputs from the 4n sensor units; and a drive circuit configured to apply an AC signal with a $\sin \omega t$ waveform to the 4n sensor units; wherein each of the 4n sensor units includes a bridge including four magnetic elements and a phase detection unit configured to retrieve signals corresponding to $\sin \theta \sin \omega t$ and $\cos \theta \sin \omega t$ from the bridge and output a signal indicating the phase $\theta$ with respect to the pitch according to an addition theorem, and signals of phase detection units of the 4n sensor units indicating the phase $\theta$ have periodic errors with n periods per pitch.

This configuration makes it possible to accurately drive the linear motor with the magnet array. In particular, the position is accurately detected in a state in which the magnetic fields from the coils of the linear motor cause an error. Also, since there are 4n sensor units, the signals thereof have phases that are each shifted by 90 degrees with respect to the error with n periods per pitch, and upon averaging the signals, it is possible to easily remove the error.

Preferably, the averaging unit is configured to add the average value of pitch origin coordinates bi detected by the 4n sensor units to the average value of intra-pitch coordinates ai (i is a natural number from 1 to 4n) from the 4n sensor units, and the 4n sensor units are configured to detect two adjacent pitches. If 4n sensor units are arranged along the length of length p or less of one pitch, they may detect two neighboring pitches. Here, the intra-pitch coordinates ai from the 4n sensor units change on a constant basis, and the pitch origin coordinates bi detected by the 4n sensor units are constant within a short range of time. In view of this, if the average values are obtained separately, the calculation is performed easily.

The above and other elements, features, steps, characteristics and advantages of the present invention will become more apparent from the following detailed description of the preferred embodiments with reference to the attached drawings.

BRIEF DESCRIPTION OF THE DRAWINGS

FIG. 5 is a diagram showing error when an installation position of a sensor unit with respect to a scale is changed.

FIG. 6 is a diagram showing output obtained by averaging the data shown in FIG. 5.

FIG. 7 is a diagram showing error when the installation position of a sensor unit from the linear motor is changed.

FIG. 8 is a diagram showing output obtained by averaging the data shown in FIG. 7.

FIG. 9 is a diagram showing errors from a reference sensor when the outputs of eight sensor units are averaged.

DETAILED DESCRIPTION OF THE PREFERRED EMBODIMENTS

Hereinafter, preferred embodiments of the present invention will be described. The scope of the present invention should be construed based on the description of the claims and in accordance with the understanding of a person skilled in the art, with reference to the description of the specification and known techniques in the field.

Figure 1:
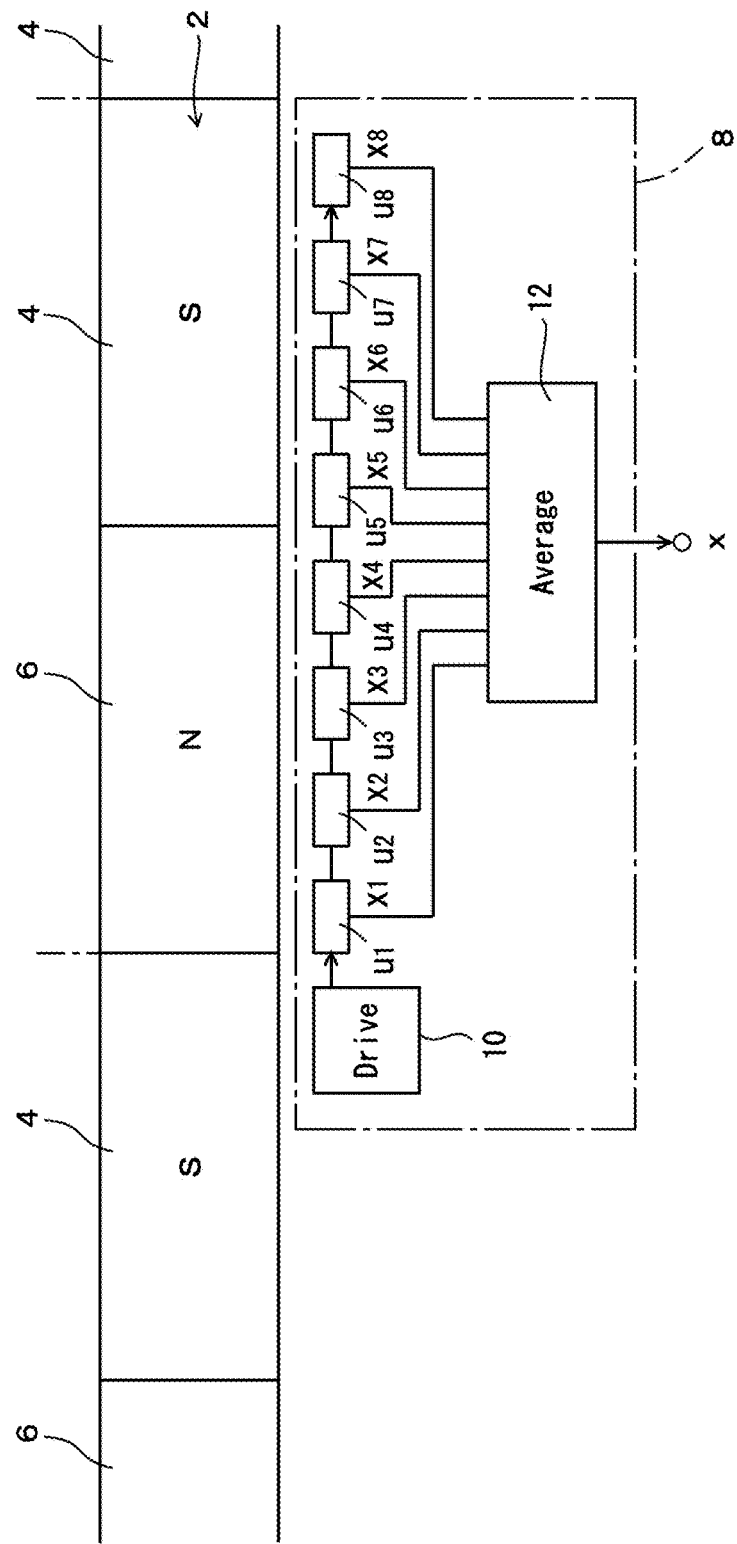
FIG. 1 is a block diagram of a displacement sensor according to a preferred embodiment of the present invention.

FIGS. 1 to 9 show preferred embodiments of the present invention. FIG. 1 shows a configuration of a displacement sensor, in which a magnetic scale 2 includes magnets 4 and 6 arranged linearly. The front surfaces of the magnets 4 are S poles, and the front surfaces of the magnets 6 are N poles, a pair of a magnet 4 and a magnet 6 is one pitch, and multiple pitches are aligned in series. The magnets 4 and 6 may be a dedicated scale for the displacement sensor or a magnet array defining part of a linear motor, and here, it is assumed that they are part of a linear motor. Note that the magnetic scale 2 may also be realized using a combination of magnetic elements and non-magnetic elements or the like instead of the magnets 4 and 6, and in such a case, a pair of one magnetic element and one non-magnetic element is one pitch. A sensor head 8 includes one drive 10, for example, and eight sensor units u1 to u8 for example, and the number of sensor units is a multiple of 4, namely 4n (n being a natural number). For example, n represents the number of periods over which the error repeats in one pitch. The drive 10 supplies an AC current to the eight sensor units u1 to u8 here, and xi is used as the output signal of the i-th sensor unit ui. The output signals x1 to x8 of the eight sensor units u1 to u8 are averaged by an averaging unit 12, and a position signal x is output. The displacement sensor of this preferred embodiment preferably is a linear displacement sensor that detects a position along the magnetic scale 2, and in particular, it is preferable that the linear position along the magnetic scale 2 is detected in order to drive a linear motor.

Note that the magnetic scale 2 may be fixed to the ground side and the sensor head 8 may be movable, or conversely, the magnetic scale 2 may be movable and the sensor head 8 may be fixed to the ground side. Also, if the magnets are installed in units of eight in the magnetic scale, for example, one unit is considered to be four pitches. If four pairs of a magnetic thin film and a non-magnetic thin film are arranged alternatingly, there are similarly considered to be four pitches.

In a one-pitch segment including one of each of the magnets 4 and 6, the eight sensor units u1 to u8 are aligned in series along the length direction (direction of measuring displacement) of the magnetic scale 2. The eight sensor units u1 to u8 constitute one sensor array. Also, the position in the one-pitch segment is indicated by a phase $\theta$ ($0 \leq \theta \leq 2\pi$), and the sensor units u1 to u8 are installed such that the phases $\theta$ are each different by 45 degrees. The differences in phase between the sensor units are values obtained by dividing $2u$ by the number of sensor units 4n. Note that in a segment of m pitches (m being a natural number greater than or equal to 2), 4 nm sensor units are aligned in series, and the signals thereof may be averaged. Here, 4n is the number of sensor units aligned in a segment of one pitch.

Figure 2:
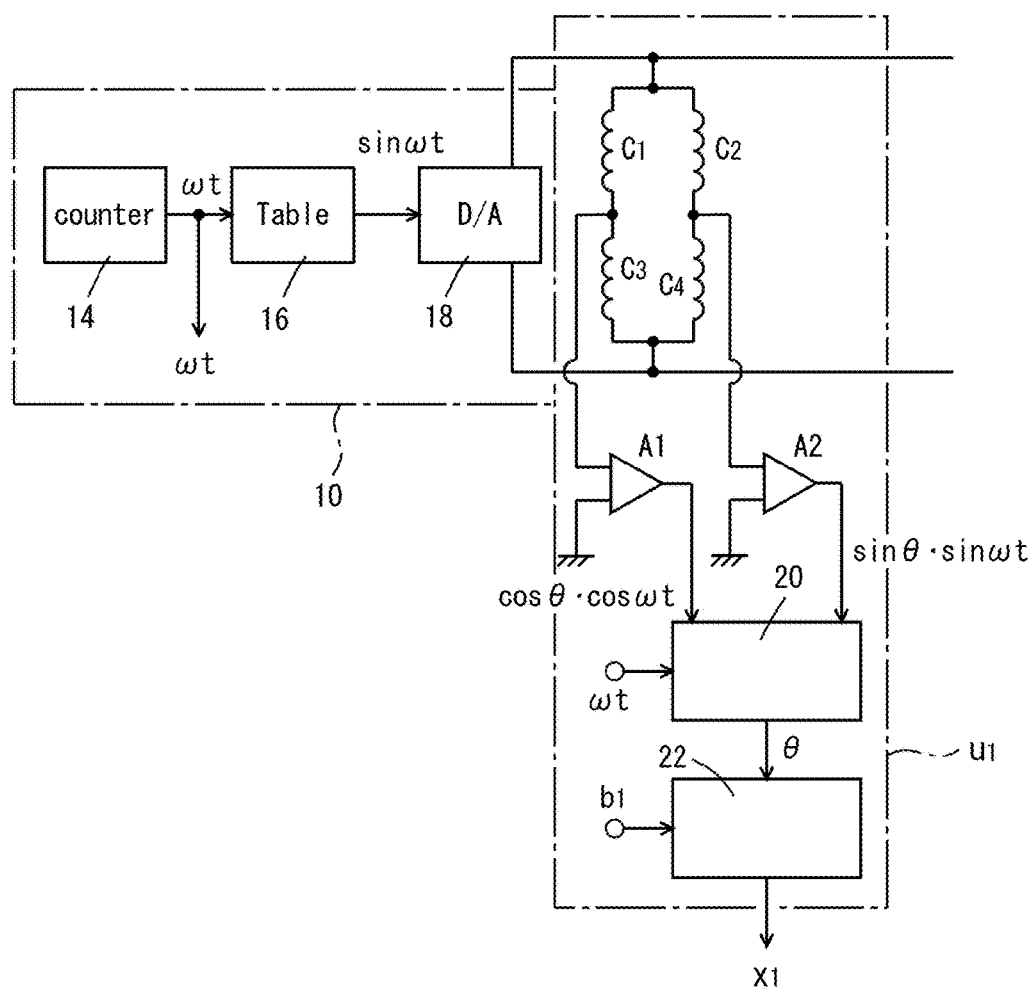
FIG. 2 is a block diagram showing relevant portions of a sensor head.

FIG. 2 shows a configuration of the drive 10 and one sensor unit u1, which is similar to the other sensor units. A counter 14 outputs the phase $\omega t$ of the alternating current and converts $\omega t$ into a digital signal equivalent to $\sin \omega t$ using a table 16, and a D/A converter 18 converts that signal into an AC voltage $\sin \omega t$ and supplies it to the sensor units u1 to u8.

In the sensor unit u1, four coils C1 to C4, for example, are aligned linearly along the longitude direction of the scale in order of the numbers from C1 to C4, and as shown in FIG. 2, they are assembled into a bridge, and an AC voltage $\sin \omega t$ is applied thereto. By amplifying the output of the bridge by the amplifiers A1 and A2, outputs equivalent to $\cos \theta \cdot \cos \omega t$ and $\sin \theta \cdot \sin \omega t$ are obtained. For example, according to the fact that $\cos \theta \cdot \cos \omega t - \sin \theta \cdot \sin \omega t = \cos(\theta + \omega t)$, the output is converted into an analog signal corresponding to $\cos(\theta + \omega t)$ by a phase detection unit 20, and a phase $\theta$ in units of one pitch is obtained from the value of $\omega t$ when $\cos(\theta + \omega t)$ is 0. Various other methods of calculating the phase $\theta$ are known, and it is possible to use any method, such as a method of using $\sin(\theta + \omega t)$. Also, various numbers of coils, connections, and the like in one sensor unit are known, and thus any may be used. Furthermore, the coils C1 to C4 are examples of magnetic elements including hole elements, magnetic resistance elements, and the like.

An offset correction unit 22 stores the change in the pitch from an initial position, and stores the currently-detected pitch number by, for example, adding or subtracting the pitch number each time the pitch changes. Also, the offset correction unit 22 stores the pitch origin coordinates bi, adds the pitch origin coordinates bi to intra-pitch coordinates ai obtained from the phase θ, thus forming an output signal xi. The intra-pitch coordinates ai are coordinates on a straight line based on the pitch origin coordinates bi, and the output signals xi are coordinates from appropriate origins. Note that if the pitch length is p and e is indicated in units of angles, ai=p×θ/360 is satisfied. Note that the offset correction unit 22 may output the pitch number so that conversion from the pitch number into the origin coordinates bi and averaging are performed by the averaging unit 12.

Figure 3:
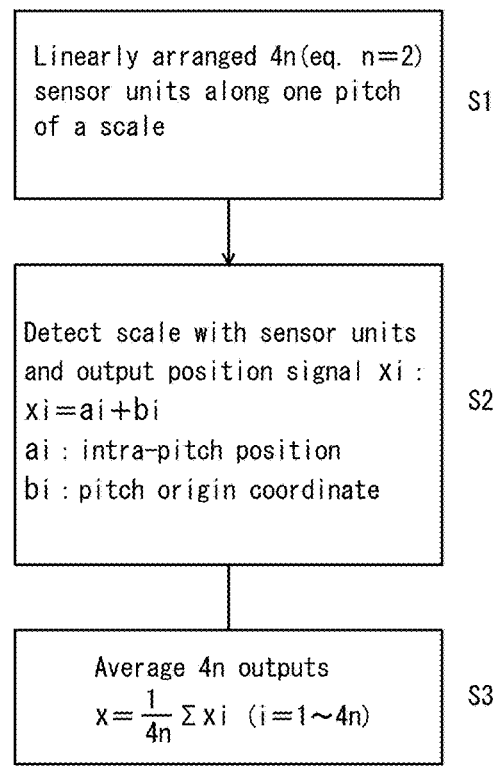
FIG. 3 is a flowchart showing a displacement detection method according to a preferred embodiment of the present invention.

The averaging unit 12 obtains an averaged output signal x by adding the eight output signals x1 to x8 and discarding the three lowest significant bits, or by shifting the added value by three bits to the lowest significant side, and x is a simple average of signals from multiple sensor units. Upon averaging the intra-pitch coordinates ai, the signal has a period of 45 degrees in terms of phase θ, and by adding the average of the pitch origin coordinates bi thereto, a signal x indicating displacement is obtained. Note that any calculation method for averaging may be used. FIG. 3 shows processing for arranging the sensor units (step 1), detecting the displacement at the sensor units (step 2), and finding the simple average of the displacements of the sensor units (step 3).

Figure 4:
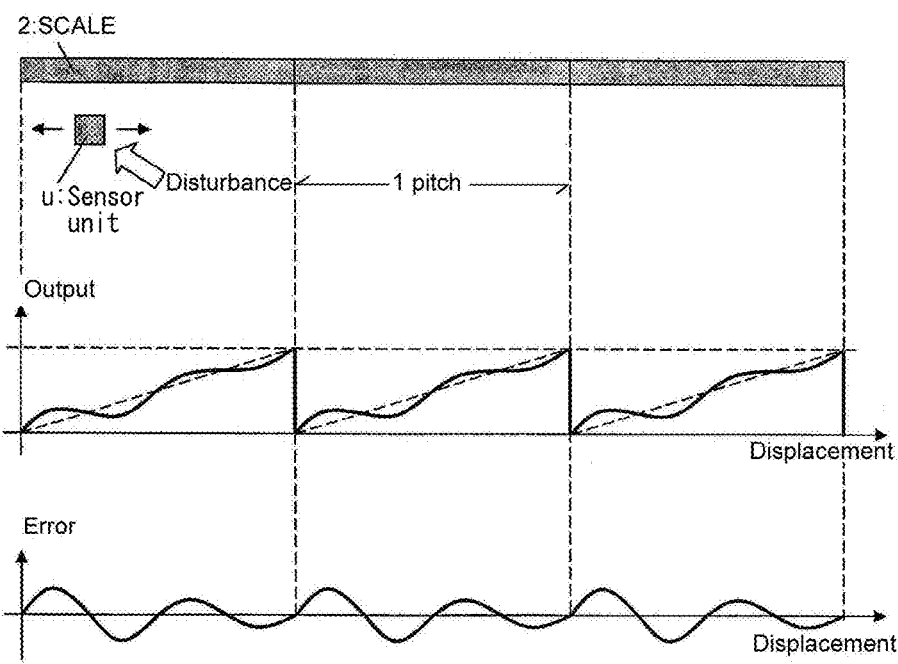
FIG. 4 is a diagram schematically showing error from a sensor unit.

FIG. 4 schematically shows a signal from a sensor unit in one pitch. The signal xi of the sensor unit includes errors of various causes and the linear displacement signal regarding the magnetic scale 2. FIG. 4 shows an example in which an error with two periods exists in one pitch, and the error is larger in the first half of each pitch than in the second half. When the sensor unit is displaced by one pitch, the magnetic environment to the coils C1 to C4 from the magnetic scale 2 is the same, and for this reason, the signal xi of the sensor unit is a periodic signal that repeats in units of one pitch, and an error ei is also a periodic signal that repeats in units of one pitch.

The errors periodic signals that repeat over n periods in one pitch, and in the experience of the inventors of preferred embodiments of the present invention, n is 1, 2, or 4. The period of the error is 1, 2, or 4 depending on the structure and usage environment of the displacement sensor, and may be identified using experimentation. Also, if 4n sensor units are provided and the output signals thereof are subjected to simple averaging, a displacement sensor with an extremely small error is obtained. Furthermore, with a change in temperature or the like, if a magnetic scale is moved by one pitch the environment will be the same, and error caused by fluctuation in temperature is canceled out.

FIGS. 5 to 9 show characteristics. In FIGS. 5 and 6, one sensor unit is used, the vertical axis indicates error, and the horizontal axis indicates the position obtained from the output of a reference sensor with high linearity and little error, and error when the interval between the sensor unit and the scale is changed is indicated. The data in FIG. 5 has not been averaged, and the data in FIG. 6 has been averaged. FIG. 5 exhibits regular error with two periods per pitch of the scale, the phase is changed by 45 degrees with respect to each curved line in FIG. 5, and upon averaging as in FIG. 6, the error is reduced.

FIGS. 7 and 8 show error when the installation position of the sensor unit with respect to the linear motor is changed, FIG. 7 shows data that has not been averaged, and FIG. 8 shows data that has been averaged in a manner similar to FIG. 6. The magnetic field from the linear motor that also uses the scale causes the error, and in FIG. 7, there is a shift in the phase and a periodic error having two periods per pitch of the scale. Upon averaging as shown in FIG. 8, the error is reduced.

In FIG. 9, eight sensor units are arranged such that the phases with respect to one pitch each differ by 45 degrees. The vertical axis indicates the error, and the horizontal axis indicates the position obtained from the output of the reference sensor. The bold line in the drawing is the average value of the signals of the eight sensor units. In this example as well, there are regular errors with two periods per pitch of the scale.

In the present preferred embodiment, focus is given to the fact that periodic errors with n periods per pitch of the scale occur. Also, for example, 4n sensor units are arranged regularly along one pitch, and by subjecting the output thereof to simple averaging, the errors are reduced. Also, signal processing is simplified using the simple average.

In the present preferred embodiment, four coils C1 to C4 were provided in each of the sensor units u1 to u8, but it is possible to provide 3, 6, 8, or more magnetic elements in each sensor unit, the coil being an example of a magnetic element. For example, in the case of using six, three signals whose phases in one pitch are different are obtained. Also, kn sensor units, for example, 2n or 4n sensor units are provided.

In this preferred embodiment, the sensor units u1 to u8 overall are configured to be able to detect two neighboring pitches. This is because the sensor head 8 moves to a subsequent pitch due to relative movement between the sensor head 8 and the magnetic scale 2.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A displacement sensor for detecting a position based on a magnetic scale by magnetic elements, the displacement sensor comprising:
    a magnetic scale including a plurality of pitches arranged linearly in a single line and including two magnets with different polarities or a pair of a magnetic element and a non-magnetic element;
    4n sensor units aligned in series in one pitch in a single line along the magnetic scale such that 4n signals with phases θ with respect to the pitch, each shifted by (90/n) degrees, are output, where n is 2 or 4;
    an averaging unit configured to output an average of the 4n signals; and
    a drive circuit configured to apply an AC signal with a sin ωt waveform to the 4n sensor units; wherein
    each of the 4n sensor units includes a bridge including four magnetic elements and a phase detection unit configured to retrieve signals corresponding to sin θ sin ωt and cos θ sin ωt from the bridge and output a signal indicating the phase θ with respect to the pitch according to an addition theorem, and signals of phase detection units of the 4n sensor units indicating the phase θ are 4n signals having periodic errors in which one pitch of the magnetic scale corresponds to n periods.

2. The displacement sensor according to claim 1, wherein
the sensor units are configured to output offset signals of the pitches during detection; and
the averaging unit is configured to obtain an average of the signals indicating the phases and the offset signals.

3. The displacement sensor according to claim 2, wherein the magnetic scale is a magnet array for a linear motor.

4. A linear displacement sensor for detecting a linear position based on a magnetic scale by magnetic elements, the linear displacement sensor comprising:
a magnetic scale including a plurality of pitches arranged linearly in a single line and including a pair of two neighboring magnets with different polarities in a magnet array for a linear motor;
4n sensor units aligned in series in a single line along a length of one pitch such that when the length of the one pitch is p, positions along the magnetic scale differ by p/(4n), where n is 2 or 4;
an averaging unit configured to output an average of outputs from the 4n sensor units; and
a drive circuit configured to apply an AC signal with a sin ωt waveform to the 4n sensor units; wherein
each of the 4n sensor units includes a bridge including four magnetic elements and a phase detection unit configured to retrieve signals corresponding to sin θ sin ωt and cos θ sin ωt from the bridge and output a signal indicating the phase θ with respect to the pitch according to an addition theorem, and signals of phase detection units of the 4n sensor units indicating the phase θ have periodic errors with n periods per pitch.

5. The linear displacement sensor according to claim 4, wherein the averaging unit is configured to add an average value of pitch origin coordinates bi detected by the 4n sensor units to an average value of intra-pitch coordinates ai from the 4n sensor units, where i is a natural number from 1 to 4n, and the 4n sensor units are configured to detect two adjacent pitches.

6. A method for detecting a displacement by detecting a position based on a magnetic scale by magnetic elements, the method comprising:
providing a magnetic scale including a plurality of pitches arranged linearly in a single line and including a pair of two neighboring magnets with different polarities in a magnet array for a linear motor;
providing 4n sensor units aligned in series in one pitch in a single line along the magnetic scale such that 4n signals with phases θ with respect to the pitch, each shifted by (90/n) degrees, are output, where n is 2 or 4;
providing a drive circuit configured to apply an AC signal with a sin ωt waveform to the 4n sensor units, each of the 4n sensor units including a bridge including four magnetic elements and a phase detection unit configured to retrieve signals corresponding to sin θ sin ωt and cos θ sin ωt from the bridge and output a signal indicating the phase θ with respect to the pitch according to an addition theorem, and signals of phase detection units of the 4n sensor units indicating the phase θ are 4n signals having periodic errors in which one pitch of the magnetic scale corresponds to n periods; and
averaging the 4n signals using an averaging unit to cancel out the periodic errors.

7. The displacement detection method according to claim 6, wherein the magnetic scale is a magnet array for a linear motor.

8. The displacement sensor according to claim 1, wherein each of the 4n sensor units outputs a pair of signals of cos θ•cos ωt and sin θ•sin ωt.

9. The displacement sensor according to claim 8, wherein the phase detection unit converts the pair of signals output by each of the 4n sensor units to the signal cos(θ+ωt)=cos θ•cos ωt−sin θ•cos ωt.

* * * * *